(12) United States Patent
Liao et al.

(10) Patent No.: US 9,871,084 B2
(45) Date of Patent: Jan. 16, 2018

(54) ORGANIC LIGHT-EMITTING DISPLAY DEVICE

(71) Applicant: AU OPTRONICS CORPORATION, Hsin-chu (TW)

(72) Inventors: Po-Sheng Liao, Hsin-chu (TW); Chia-Yuan Yeh, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/435,938

(22) Filed: Feb. 17, 2017

(65) Prior Publication Data
US 2017/0250228 A1 Aug. 31, 2017

(30) Foreign Application Priority Data
Feb. 26, 2016 (TW) .............................. 105105835 A

(51) Int. Cl.
*H01L 27/32* (2006.01)
*H01L 51/52* (2006.01)

(52) U.S. Cl.
CPC ........ *H01L 27/323* (2013.01); *H01L 27/3276* (2013.01); *H01L 51/5246* (2013.01)

(58) Field of Classification Search
CPC .................................................... H01L 27/323
USPC ......................................................... 257/53
See application file for complete search history.

(56) References Cited

U.S. PATENT DOCUMENTS

| | | | |
|---|---|---|---|
| 8,872,168 B2 | 10/2014 | Choi et al. | |
| 9,118,036 B2 * | 8/2015 | Kim | ....................... H01L 27/323 |
| 9,455,419 B2 * | 9/2016 | Hong | .................. H01L 27/3276 |
| 2011/0014731 A1 | 1/2011 | Nguyen et al. | |
| 2012/0097512 A1 | 4/2012 | Choi | |
| 2013/0306946 A1 | 11/2013 | Chang et al. | |
| 2014/0362032 A1 | 12/2014 | Mo et al. | |

* cited by examiner

*Primary Examiner* — Chandra Chaudhari
(74) *Attorney, Agent, or Firm* — Tim Tingkang Xia, Esq.; Locke Lord LLP

(57) ABSTRACT

An organic light-emitting display device includes a first substrate, a second substrate, a sealing adhesive layer, an organic light-emitting device and a touch sensing device. The first substrate and the second substrate are disposed opposite to each other. The sealing adhesive layer is disposed between the first substrate and the second substrate in a peripheral region. The organic light-emitting device is disposed on the second substrate in a display region, and the sealing adhesive layer surrounds the organic light-emitting device. The touch sensing device is disposed on the first substrate and includes a touch sensing electrode array and a plurality of sensing wires electrically connected to the touch sensing electrode array, respectively, and the sensing wires are disposed along the peripheral region at at least one side of the display region and over the sealing adhesive layer.

10 Claims, 6 Drawing Sheets

ORGANIC LIGHT-EMITTING DISPLAY DEVICE

CROSS-REFERENCE TO RELATED PATENT APPLICATION

This application claims the benefit of priority to Taiwan Patent Application No. 105105835, filed Feb. 26, 2016. The entire content of the above identified application is incorporated herein by reference.

Some references, which may include patents, patent applications, and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to relates to an organic light-emitting display device, and more particularly to an organic light-emitting display device having a touch sensing device.

BACKGROUND

In recent years, the organic light-emitting display device (OLED device) has gradually become a popular emerging flat panel display, and has been widely used in various flat panel display products due to its advantages of self-illumination, wide viewing angle, short response time, high luminous efficiency, low operating voltage, small panel thickness, capability of being made into a flexible panel, and simple manufacturing process.

Since the luminous efficiency of an organic light-emitting diode of the organic light-emitting display device is affected and gradually decreased in the air containing a certain amount of moisture and oxygen, the organic light-emitting diode needs to be encapsulated in degree of vacuum of $10^{-9}$ to $10^{-12}$ Torr, in order to avoid impacts of moisture and oxygen on the display efficiency of the organic light-emitting display device. Currently, the organic light-emitting diode is disposed between two glass substrates, and is sealed within the space between the glass substrates through a glass frit. In a conventional organic light-emitting display device, the glass frit has better anti-moisture properties, thereby replacing the UV-curing adhesive for encapsulating the organic light-emitting diode.

When a touch panel is applied in the organic light-emitting display device, the wiring of the touch panel must bypass the applying region of the glass frit to avoid that the laser light cannot completely cure the glass frit due to being blocked by the wiring. However, the peripheral region of such an organic light-emitting display device is limited by the wiring and the width of the glass frit and cannot be further reduced.

In view of this, it is an objective in the art to provide an organic light-emitting display device to reduce the border width of the organic light-emitting display device.

SUMMARY

The main objective of the present disclosure is to provide an organic light-emitting display device to reduce the border width of the organic light-emitting display device.

One embodiment of the present disclosure provides an organic light-emitting display device having a display region and a peripheral region, and the peripheral region is disposed surrounding the display region. The organic light-emitting display device includes a first substrate, a second substrate, a sealing adhesive layer, an organic light-emitting device, and a touch sensing device. The first substrate and the second substrate are disposed opposite to each other. The sealing adhesive layer is disposed between the first substrate and the second substrate in the peripheral region. The organic light-emitting device is disposed on the second substrate in the display region, and the sealing adhesive layer surrounds the organic light-emitting device. The touch sensing device is disposed on the first substrate, wherein the touch sensing device includes a touch sensing electrode array and a plurality of sensing wires electrically connected to the touch sensing electrode array, respectively. The sensing wires are disposed along the peripheral region at at least one side of the display region and over the sealing adhesive layer.

In the organic light-emitting display device of the present disclosure, since the sensing wires can be disposed overlapping the sealing adhesive layer, the spacing between the touch sensing electrode array and the sealing adhesive layer can be reduced, and thus the border width of the organic light-emitting display device is effectively reduced or the touch sensitivity of the touch sensing device is effectively increased.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
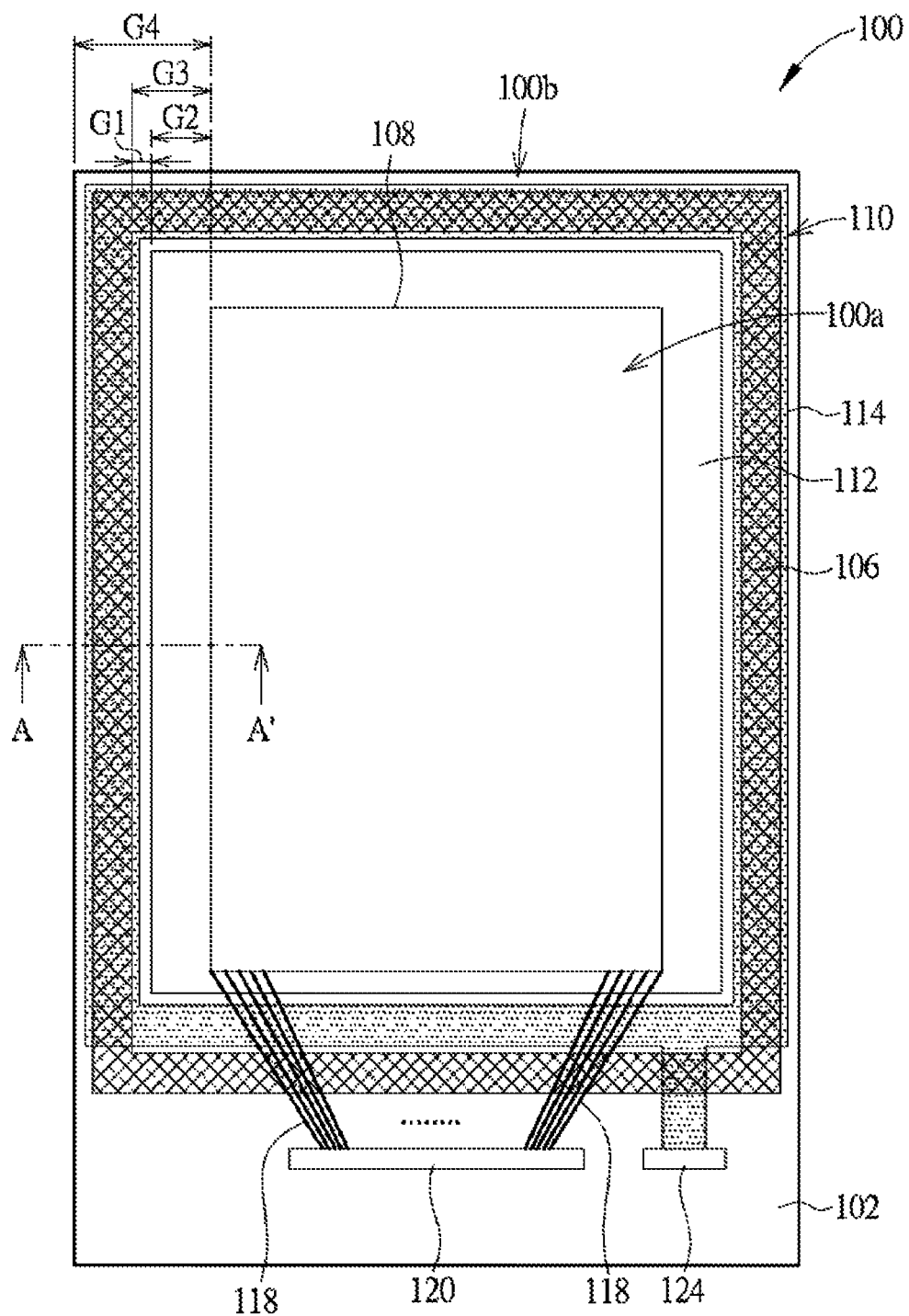
FIG. 1 is a schematic top view of an organic light-emitting display device according to a first embodiment of the present disclosure.
Figure 2:
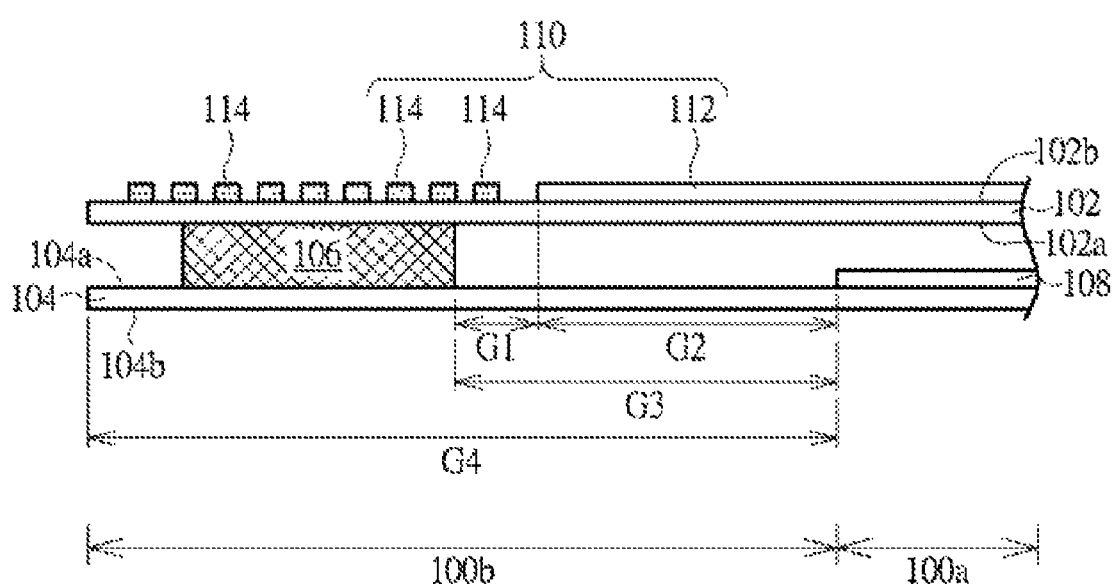
FIG. 2 is a schematic cross-sectional view taken along the section line A-A' in FIG. 1.

Referring to FIGS. 1 and 2, FIG. 1 is a schematic top view of an organic light-emitting display device according to a first embodiment of the present disclosure, and FIG. 2 is a schematic cross-sectional view taken along the section line A-A' in FIG. 1. As shown in FIG. 1 and FIG. 2, the organic light-emitting display device 100 has a display region 100a and a peripheral region 100b, and the peripheral region 100b is disposed surrounding the display region 100a. For example, the display region 100a is provided for disposing an organic light-emitting device for displaying pictures and a touch sensing device providing a touch function. The peripheral region 100b is provided for disposing sensing wires and elements that control the organic light-emitting device and the touch sensing device.

The organic light-emitting display device 100 may include a first substrate 102, a second substrate 104, a sealing adhesive layer 106, the organic light-emitting device 108 and the touch sensing device 110. The first substrate 102 and the second substrate 104 are disposed opposite to each other, and the sealing adhesive layer 106 is disposed between the first substrate 102 and the second substrate 104 in the peripheral region 100b for sealing the first substrate 102 and the second substrate 104. The organic light-emitting device 108 is disposed on the second substrate 104 in the display region 100a, and the sealing adhesive layer 106 surrounds the organic light-emitting device 108. The touch sensing device 110 is disposed on the first substrate 102. The touch sensing device 110 includes a touch sensing electrode array 112 and a plurality of sensing wires 114 electrically connected to the touch sensing electrode array 112, respectively. The sensing wires 114 are disposed along the peripheral region 100b at at least one side of the display region 100a and over the sealing adhesive layer 106. Specifically, the first substrate 102 has an inner surface 102a and an outer surface 102b opposite to each other, the second substrate 104 may also have an inner surface 104a and an outer surface 104b opposite to each other, and the inner surface 102a of the first substrate 102 is disposed facing the inner surface 104a of the second substrate 104. The organic light-emitting device 108 is disposed on the inner surface 104a of the second substrate 104, and is configured to emit lights toward the first substrate 102 and can define the display region 100a. For example, the first substrate 102 and the second substrate 104 may be transparent substrates, for example but not limited to, plastic substrates, glass substrates, tempered glass substrates, quartz substrates or sapphire substrates. The sealing adhesive layer 106 may be, for example, a glass frit to provide sufficient capability of blocking the moisture and oxygen. The organic light-emitting device 108 may include a plurality of white organic light-emitting diodes that form a pixel array and are independently controlled through an array circuit. A color filter and a black matrix may be disposed on the first substrate 102, and the lights emitted by the organic light-emitting device 108 form color pictures after passing through the color filter. The present disclosure is not limited thereto. Those skilled in the art should understand that the organic light-emitting device 108 may also include a plurality of organic light-emitting diodes emitting different color lights to constitute pixel units, or the organic light-emitting device may have different changes and designs according to the actual requirements.

In the present embodiment, the organic light-emitting display device 100 may further include a plurality of peripheral wires 118 disposed on the inner surface 104a of the second substrate 104 in the peripheral region 100b, and the peripheral wires 118 are electrically connected to the organic light-emitting device 108, respectively. A part of the peripheral wires 118 are located between the sealing adhesive layer 106 and the second substrate 104. Specifically, the peripheral wires 118 are configured to electrically connect the organic light-emitting device 108 to a control element, thus extending from the second substrate 104 within an area surrounded by the sealing adhesive layer 106 to the second substrate 104 outside the sealing adhesive layer 106, such that the peripheral wires 118 run across the sealing adhesive layer 106, and the part of the peripheral wires 118 are disposed overlapping the sealing adhesive layer 106 in a projection direction perpendicular to the second substrate 104. In the present embodiment, the organic light-emitting display device 100 may further include at least one first integrated circuit 120 disposed on the inner surface 104a of the second substrate 104 in the peripheral region 100b, and the sealing adhesive layer 106 is disposed between the first integrated circuit 120 and the organic light-emitting device 108. Specifically, the first integrated circuit 120 includes a plurality of first connection pads (not shown), the peripheral wires 118 are electrically connected to the corresponding first connection pads, respectively, and the first integrated circuit 120 is a display driving integrated circuit.

The touch sensing device 110 of the present embodiment is disposed on the outer surface 102b of the first substrate 102, and is disposed corresponding to the display region 100a and extending towards the peripheral region 100b. For example, when the touch sensing device 110 conducts touch sensing in a mutual capacitance manner, the touch sensing electrode array 112 of the touch sensing device 110 may include driving electrodes and sensing electrodes extending in different directions and intersecting with each other. Preferably, the distribution range of the touch sensing electrode array 112 may be larger than the organic light-emitting devices 108, and the touch sensing electrode array 112 further extends to the peripheral region 100b, such that the touch sensing electrode array 112 can not only detect that the user touches the location of a corresponding particular pixel, but also can detect that the user touches the peripheral region 100b adjacent to the display region 100a of the organic light-emitting display device 100 to perform other functions. The touch sensing electrode array 112 may be formed of a transparent conductive material, for example, indium zinc oxide or indium tin oxide. The sensing wires 114 may be electrically connected to each driving electrode and each sensing electrode to provide drive signals to the driving electrodes and receive sensing signals from the sensing electrodes. Specifically, the sensing wires 114 may be connected to one or two ends of each driving electrode and/or to one or two ends of each sensing electrode and may be disposed overlapping the sealing adhesive layer 106 in a projection direction perpendicular to the first substrate 102, such that the sensing wires 114 extend in the extending direction of the sealing adhesive layer 106 and are located at at least two sides of the touch sensing electrode array 112. For example, a distribution width of the sensing wires 114 may be larger than a width of the sealing adhesive layer 106. When the sensing wires 114 are connected to the two ends of each driving electrode and to the two ends of each sensing electrode, respectively, the sensing wires 114 may be located within the peripheral region 100b around the touch sensing electrode array 112, but the present disclosure is not limited thereto. In another alternative embodiment, the organic light-emitting device 108 and the touch sensing electrode array 112 may not be rectangular and may also be any other geometric shapes, so the sensing wires 114 may be disposed along the peripheral region 100b at any side of the touch sensing electrode array 112. The touch sensing device of the present disclosure is not limited to the structure described above, and those skilled in the art should understand that the touch sensing device 110 may also conduct touch sensing in a self-capacitance manner, and corresponding designs and changes can be carried out on the touch sensing electrode array 112. The sensing wires 114 may be formed of a non-transparent conductive material, for example, metal.

Figure 3:
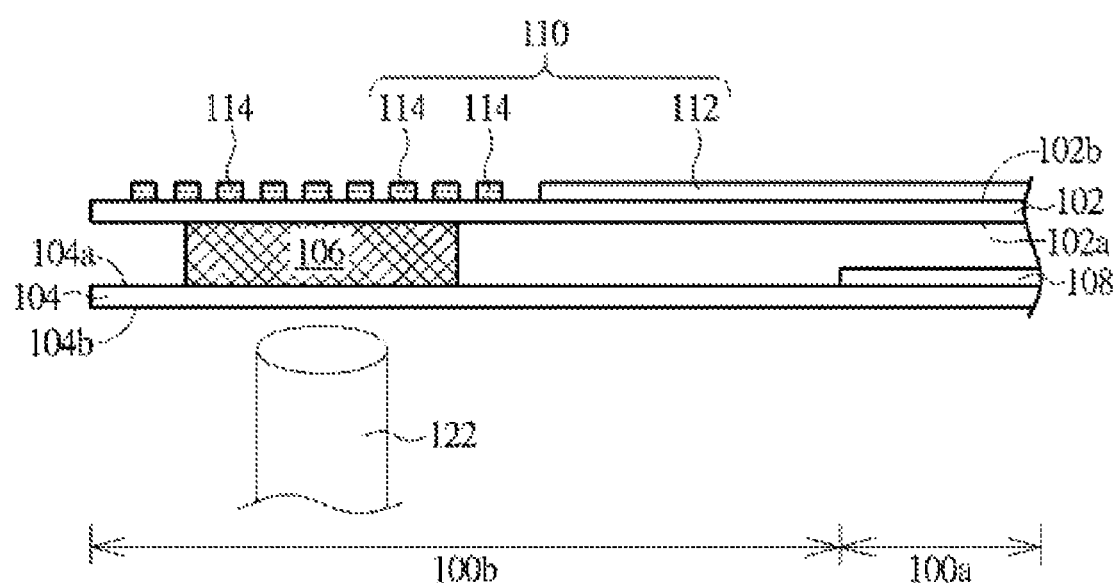
FIG. 3 is a schematic view of a curing method of a sealing adhesive layer disposed overlapping sensing wires in the present disclosure.

It should be noted that, in this embodiment, a metal layer is not disposed on the inner surface 104a of the second substrate 104 corresponding to the sealing adhesive layer 106 except the distribution region of the peripheral wires 118. Specifically, a non-light transmitting layer is not disposed on the second substrate 104 within the overlapping area of the sensing wires 114 and the sealing adhesive layer 106, such that the light may be irradiated to the sealing adhesive layer 106 through the second substrate 104. Further referring to FIG. 3, a schematic view of a curing method of the sealing adhesive layer disposed overlapping the sensing wires in the present embodiment is shown. As shown in FIG. 3, when the sealing adhesive layer 106 overlapping the sensing wires 114 is cured, a laser 122 is disposed at the outer surface 104b of the second substrate 104 to irradiate the laser light through the second substrate 104. Since a metal layer is not disposed on the second substrate 104 corresponding to the sealing adhesive layer 106, the laser light may be irradiated to the sealing adhesive layer 106 from the outer surface 104b of the second substrate 104 and reflected by the sensing wires 114, to cure the sealing adhesive layer 106 effectively.

In another alternative embodiment, the organic light-emitting display device may further include a non-transparent pattern, which is disposed on the first substrate 102 at at least one side of the touch sensing electrode array 112 and disposed overlapping the sealing adhesive layer 106, to reflect the laser light not irradiated to the sensing wires 114. When the sensing wires 114 are not located within the peripheral region 100b around the touch sensing electrode array 112, or the distribution range of the sensing wires 114 does not cover the sealing adhesive layer 106, the non-transparent pattern may be used to compensate for the curing efficiency of the sealing adhesive layer 106 not overlapping the sensing wires 114, such that the laser light irradiated from the outer surface 104b of the second substrate 104 can be reflected sufficiently to increase the curing efficiency of the sealing adhesive layer 106. For example, the non-transparent pattern may be a non-transparent dummy electrode, and is separated from and electrically insulated from the sensing wires 114. Preferably, the non-transparent dummy electrode and the sensing wires 114 may be formed by a same non-transparent conductive layer.

In addition, the sensing wires 114 may extend to the outer surface 102b of the first substrate 102 outside the sealing adhesive layer 106, to electrically connect the touch sensing electrode array 112 to a touch circuit element or a touch control element. In the present embodiment, the organic light-emitting display device 100 may further include at least one second integrated circuit 124 disposed on the outer surface 102b of the first substrate 102 outside the sealing adhesive layer 106, and the sealing adhesive layer 106 is disposed between the second integrated circuit 124 and the touch sensing electrode array 112, as shown in FIG. 1. Precisely, the second integrated circuit 124 includes a plurality of second connection pads (not shown), the touch sensing electrode array 112 is electrically connected to the corresponding second connection pads respectively through the sensing wires 114, and the second integrated circuit 124 is a touch drive integrated circuit. It should be noted that, since a part of the peripheral wires 118 are disposed overlapping the sealing adhesive layer 106, if the laser light is irradiated to the part of the sealing adhesive layer 106 overlapping the peripheral wires 118 from the outer surface 104b of the second substrate 104, the laser light may be blocked by the peripheral wires 118 and cannot cure this part of the sealing adhesive layer 106. Thereby, in the organic light-emitting display device 100 of the present embodiment, a part of the sensing wires 114 are disposed overlapping a part of the peripheral wires 118, and the part of the sensing wires 114 are located between the sealing adhesive layer 106 and the touch sensing electrode array 112, in other words, the part of the sensing wires 114 are disposed not overlapping the sealing adhesive layer 106 in a projection direction perpendicular to the first substrate 102, such that the laser light may be irradiated to the part of the sealing adhesive layer 106 overlapping the peripheral wires 118 from the outer surface 102b of the first substrate 102. In other words, in the present embodiment, the part of the sensing wires 114 disposed adjacent to the overlapping area of the peripheral wires 118 and the sealing adhesive layer 106 are disposed between the sealing adhesive layer 106 and the touch sensing electrode array 112, such that the part of the sensing wires 114 bypasses the overlapping area of the peripheral wires 118 and the sealing adhesive layer 106, and extend to the second connection pads outside the sealing adhesive layer 106 to electrically connect with the second integrated circuit 124. In the present embodiment, the first integrated circuit 120 and the second integrated circuit 124 are located at the same side of the display region 100a, but the present disclosure is not limited thereto. In another alternative embodiment, the part of the sensing wires 114 overlapping the peripheral wires 118 may be located outside the sealing adhesive layer 106, that is, the part of the sensing wires 114 is located outside the sealing adhesive layer 106 across the area of the peripheral wires 118, such that the sealing adhesive layer 106 is located between the part of the sensing wires 114 and the touch sensing electrode array 112.

Figure 4:
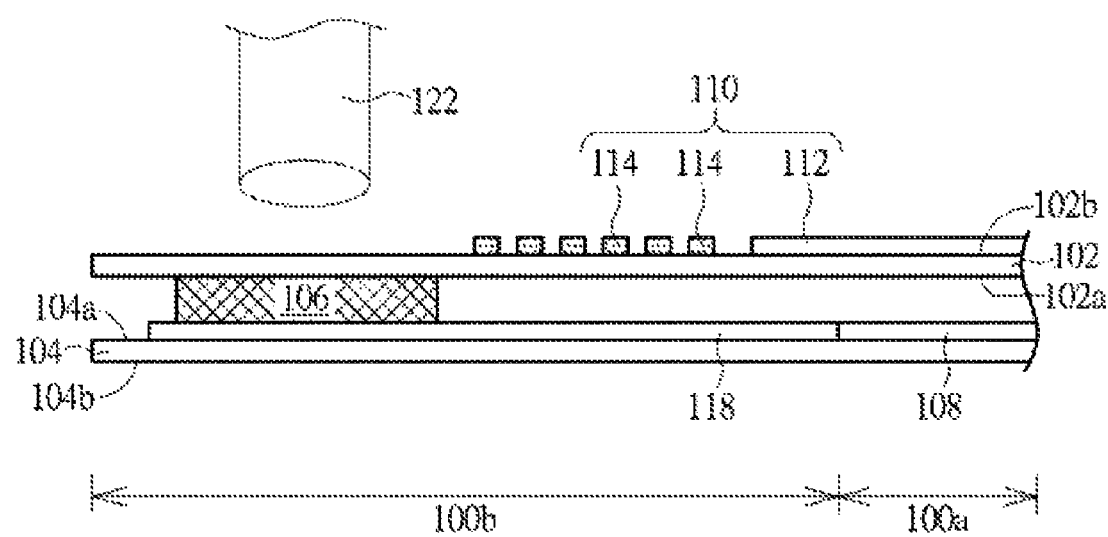
FIG. 4 is a schematic view of the curing method of the sealing adhesive layer disposed overlapping peripheral wires in the present disclosure.

Referring to FIG. 4, a schematic view of the curing method of the sealing adhesive layer disposed overlapping the peripheral wires in the present embodiment is shown. As shown in FIG. 4, when the sealing adhesive layer 106 overlapping the sensing wires 118 is cured, the laser 122 is disposed at the outer surface 102b of the first substrate 102 to irradiate the laser light through the first substrate 102. Since a non-light transmitting layer is not disposed on the first substrate 102 corresponding to the overlapping area of the sealing adhesive layer 106 and the peripheral wires 118, the laser light may be irradiated to the sealing adhesive layer 106 from the outer surface 102b of the first substrate 102 and reflected by the peripheral wires 118 to cure the sealing adhesive layer 106 effectively.

It can be seen from the above that the sensing wires 114 of the organic light-emitting display device 100 of the present embodiment can not only serve as lines for transmitting driving signals or sensing signals, but also serve as reflective layers of the laser light for curing the sealing adhesive layer 106, thereby increasing the curing efficiency of the sealing adhesive layer 106. Referring to FIG. 1 and FIG. 2, it can be known that the sensing wires 114 may be disposed overlapping the sealing adhesive layer 106 in a projection direction perpendicular to the first substrate 102, so the spacing G1 between the touch sensing electrode array 112 and the sealing adhesive layer 106 may be reduced, for example, the spacing G1 is reduced from about 300 micrometers to about 50 micrometers. When the spacing G2 (for example, about 40 micrometers) between the edge of the organic light-emitting device 108 and the edge of the touch sensing electrode array 112 is constant, compared with the conventional organic light-emitting display device, the spacing G4 between the edge of the display region 100a defined by the organic light-emitting device 108 and the edge of the organic light-emitting display device 100, i.e., the width of the peripheral region 100b may be effectively reduced in the present embodiment, such that the organic light-emitting display device 100 achieves a narrow border without affecting the touch sensitivity of the touch sensing device 110. For example, the width of the peripheral region 100b (i.e., the spacing G4) may be reduced from 1100 micrometers to 890 micrometers. When the spacing G3 (for example, about 300 micrometers) between the edge of the organic light-emitting device 108 and the inner side of the sealing adhesive layer 106 facing the organic light-emitting device 108 is constant, the spacing G2 (for example, about 250 micrometers) between the edge of the touch sensing electrode array 112 and the edge of the organic light-emitting device 108 can be increased effectively. In other words, the area of the touch sensing electrode array 112 can be increased, the resistive-capacitive load of the touch sensing electrode array 112 is reduced and the touch sensitivity of the touch sensing device 110 of the organic light-emitting display device 100 is increased. For example, as the spacing G3 ranges from substantially 90 micrometers to about 300 micrometers, the spacing G2 between the edge of the touch sensing electrode array 112 and the edge of the organic light-emitting device 108 is increased from about 40 micrometers to about 250 micrometers, and the touch sensing frequency may be increased from 165 Kilo Hertz (kHz) to 374 kHz.

The organic light-emitting display device of the present disclosure is not limited to the above embodiments. Other embodiments or alternative embodiments of the present disclosure will be further described below. The same reference numerals are used to mark the same elements and descriptions of the repeated portions are omitted below for simplification and to highlight the differences between the embodiments or alternative embodiments.

Figure 5:
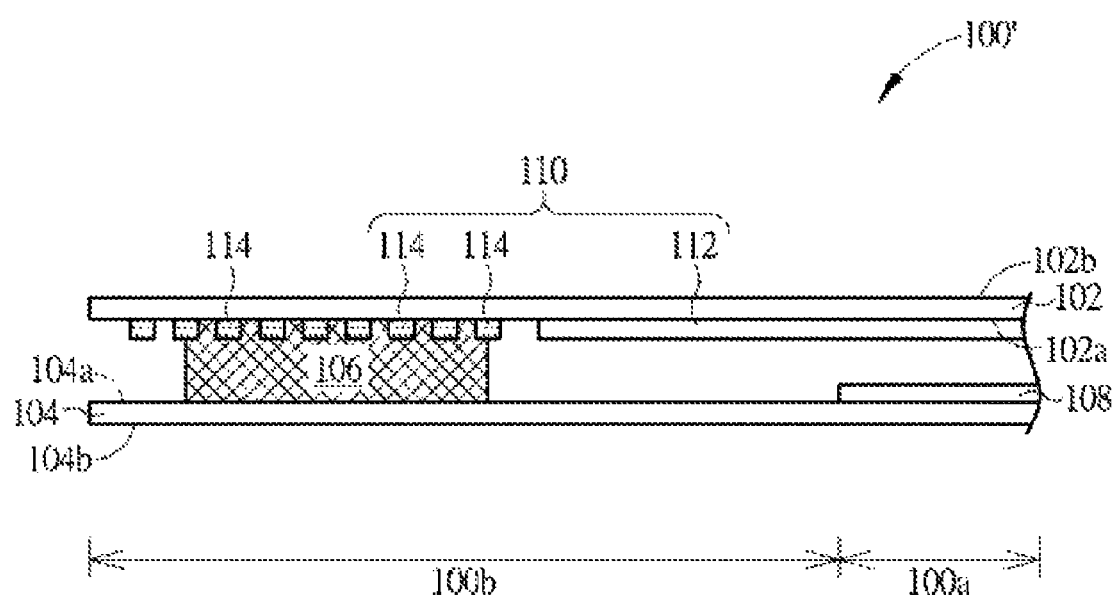
FIG. 5 is a schematic cross-sectional view of an organic light-emitting display device in another alternative embodiment of the first embodiment of the present disclosure.

Referring to FIG. 5, a schematic cross-sectional view of the organic light-emitting display device in another alternative embodiment of the first embodiment of the present disclosure is shown. As shown in FIG. 5, compared with the first embodiment, the touch sensing device 110 of the organic light-emitting display device 100 provided by this alternative embodiment is disposed on the inner surface 102a of the first substrate 102. In this alternative embodiment, the second integrated circuit 124 is also disposed on the inner surface 102a of the first substrate 102.

Figure 6:
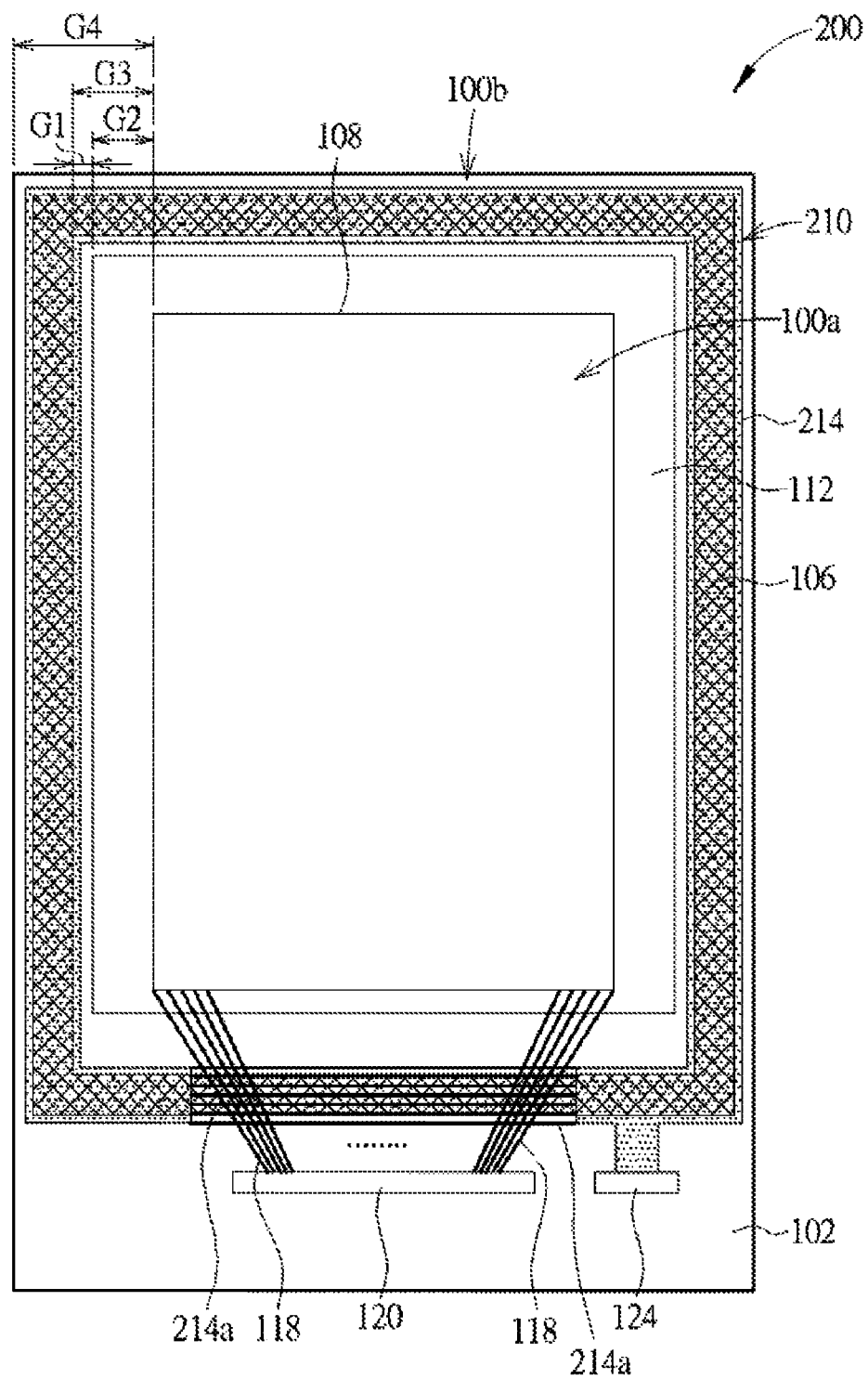
FIG. 6 is a schematic top view of an organic light-emitting display device according to a second embodiment of the present disclosure.

Referring to FIG. 6, a schematic top view of the organic light-emitting display device according to a second embodiment of the present disclosure is shown. As shown in FIG. 6, compared with the first embodiment, metallic sensing wires 214 of the organic light-emitting display device 200 provided by the present embodiment do not run across the peripheral wires 118 and are replaced by transparent sensing wires 214a. In the present embodiment, a touch sensing device 210 of the organic light-emitting display device 200 may further include a plurality of transparent sensing wires 214a that are disposed on the outer surface 102b of the first substrate 102 and electrically connected to the touch sensing electrode array 112 through the metallic sensing wires 214. The transparent sensing wires 214a are disposed overlapping a part of the peripheral wires 118 and the sealing adhesive layer 106 in a projection direction perpendicular to the first substrate 102, and the sealing adhesive layer 106 is located between the transparent sensing wires 214a and the part of the peripheral wires 118. For example, the two ends of each sensing wire 214 are correspondingly connected to the two ends of each transparent sensing wire 214a. The transparent sensing wires 214a extend in the extending direction of the sealing adhesive layer 106, overlap the sealing adhesive layer 106 and run across the peripheral wires 118 at the same time, such that the sealing adhesive layer 106 corresponding to the peripheral wires 118 may be cured through irradiation of the laser light from the outer surface 102b of the first substrate 102. In another alternative embodiment, the touch sensing device 210 may also be disposed on the inner surface 102a of the first substrate 102.

In conclusion, the sensing wires of the organic light-emitting display device of the present disclosure can not only serve as lines for transmitting drive signals or sensing signals, but also as reflective layers of the laser light for curing the sealing adhesive layer, thereby increasing the curing efficiency of the sealing adhesive layer, so it is not necessary to additionally dispose a metal layer between the second substrate and the sealing adhesive layer in the organic light-emitting display device. Since the sensing wires can be disposed overlapping the sealing adhesive layer, the spacing between the touch sensing electrode array and the sealing adhesive layer may be reduced, and thus the border width of the organic light-emitting display device is effectively reduced or the touch sensitivity of the touch sensing device is effectively increased.

The above description only provides preferred embodiments of the present disclosure, and all equivalent changes and modifications made according to the claims of the present disclosure falls within the scope of the present disclosure.

What is claimed is:

1. An organic light-emitting display device having a display region and a peripheral region, the peripheral region being disposed surrounding the display region, wherein the organic light-emitting display device comprises:
    a first substrate and a second substrate, disposed opposite to each other;
    a sealing adhesive layer, disposed between the first substrate and the second substrate in the peripheral region;
    an organic light-emitting device, disposed on the second substrate in the display region, the sealing adhesive layer surrounding the organic light-emitting device; and
    a touch sensing device, disposed on the first substrate, wherein the touch sensing device comprises a touch sensing electrode array and a plurality of sensing wires electrically connected to the touch sensing electrode array, respectively, and the sensing wires are disposed along at least one side of the peripheral region and over the sealing adhesive layer.

2. The organic light-emitting display device according to claim 1, wherein the first substrate has an inner surface and an outer surface opposite to each other, the inner surface faces the second substrate, and the touch sensing device is disposed on the inner surface.

3. The organic light-emitting display device according to claim 1, wherein the first substrate has an inner surface and an outer surface opposite to each other, the inner surface faces the second substrate, and the touch sensing device is disposed on the outer surface.

4. The organic light-emitting display device according to claim 1, wherein a spacing exists between the organic light-emitting device and the sealing adhesive layer, the spacing ranging from substantially 90 micrometers to 300 micrometers.

5. The organic light-emitting display device according to claim 1, further comprising a plurality of peripheral wires disposed on the second substrate in the peripheral region, wherein the peripheral wires are electrically connected to the organic light-emitting device, respectively, and a part of the peripheral wires are located between the sealing adhesive layer and the second substrate.

6. The organic light-emitting display device according to claim 5, wherein a part of the sensing wires are disposed overlapping a part of the peripheral wires, and are not overlapping the sealing adhesive layer in a projection direction perpendicular to the first substrate.

7. The organic light-emitting display device according to claim 5, wherein the touch sensing device further comprises a plurality of transparent sensing wires electrically connected to the touch sensing electrode array, respectively, wherein the transparent sensing wires are disposed overlapping a part of the peripheral wires and the sealing adhesive layer, and the sealing adhesive layer is located between the transparent sensing wires and the part of the peripheral wires in a projection direction perpendicular to the first substrate.

8. The organic light-emitting display device according to claim 5, further comprising at least one first integrated circuit disposed on the second substrate in the peripheral region, wherein the first integrated circuit is electrically connected to the peripheral wires, and the sealing adhesive layer is disposed between the first integrated circuit and the organic light-emitting device.

9. The organic light-emitting display device according to claim 1, further comprising at least one second integrated circuit, wherein the second integrated circuit is electrically connected to the sensing wires and is disposed in the peripheral region outer than the sealing adhesive layer.

10. The organic light-emitting display device according to claim 1, wherein the touch sensing electrode array is disposed corresponding to the display region and a portion of the peripheral region.

* * * * *